US008816724B2

(12) United States Patent
Kennedy

(10) Patent No.: US 8,816,724 B2
(45) Date of Patent: Aug. 26, 2014

(54) NESTED DIGITAL DELTA-SIGMA MODULATOR

(71) Applicant: University College Cork—National University of Ireland, Cork, Cork (IE)

(72) Inventor: Michael Peter Kennedy, Ballincollig (IE)

(73) Assignee: University College Cork—National University of Ireland, Cork, Cork (IE)

( * ) Notice: Subject to any disclaimer, the term of this patent is extended or adjusted under 35 U.S.C. 154(b) by 0 days.

(21) Appl. No.: 13/715,529

(22) Filed: Dec. 14, 2012

(65) Prior Publication Data

US 2013/0154690 A1 Jun. 20, 2013

Related U.S. Application Data

(60) Provisional application No. 61/576,411, filed on Dec. 16, 2011.

(51) Int. Cl.
*H03B 21/00* (2006.01)
(52) U.S. Cl.
USPC ........................................ 327/105; 327/159
(58) Field of Classification Search
CPC .... H03C 3/0925; H03C 3/0933; H03L 7/193; H03L 7/1974; H03L 7/1976
USPC .................. 327/105–107, 147, 150, 156, 159
See application file for complete search history.

(56) References Cited

U.S. PATENT DOCUMENTS

| 4,965,531 | A | 10/1990 | Riley |
| 5,038,117 | A | 8/1991 | Miller |
| 6,236,275 | B1 * | 5/2001 | Dent ............................. 331/1 A |
| 6,836,526 | B2 * | 12/2004 | Rana ............................... 377/47 |
| 6,927,716 | B2 | 8/2005 | Keaveney et al. |
| 7,006,024 | B2 | 2/2006 | Keaveney et al. |
| 7,024,171 | B2 | 4/2006 | Gibbs |
| 7,081,798 | B2 | 7/2006 | Muller et al. |
| 7,317,360 | B2 | 1/2008 | Keaveney |

(Continued)

FOREIGN PATENT DOCUMENTS

| KR | 10-2005-0105228 | 3/2005 |
| KR | 10-0698862 | 3/2007 |

(Continued)

OTHER PUBLICATIONS

Miller et al., "A Multiple Modulator Fractional Divider," IEEE Transactions on Instrumentation and Measurement, vol. 40, No. 3, Jun. 1991. 6 pages.
Kennedy et al., "High Speed , High Accuracy Fractional—$N$ Frequency Synthesizer using Nested Mixed-Radix Digital $\Delta$—$\Sigma$ Modulators," In Proc. ESSCIRC 2013, Bucharest, Romania, Sep. 18-20, 2013. 4 pages.

*Primary Examiner* — William Hernandez
(74) *Attorney, Agent, or Firm* — Knobbe, Martens, Olson & Bear, LLP

(57) ABSTRACT

Methods and systems are disclosed that provide a radio frequency synthesizer that generates precise frequencies over a large radio frequency range. The radio frequency synthesizer can provide a high resolution of frequency generation and still provide precise frequencies over a range of radio frequencies. The precision and resolution while maintaining a large operating range come from the ability of the frequency synthesizer to generate frequencies as a product of a plurality of moduli. For example, the frequency can be generated from a reference frequency using a first modulus and a second modulus. The plurality of modulo can be implemented using nested digital delta-sigma modulators in a fractional-N frequency synthesizer.

29 Claims, 5 Drawing Sheets

(56) References Cited

U.S. PATENT DOCUMENTS

| | | | |
|---|---|---|---|
| 7,324,030 B2 | 1/2008 | Riley | |
| 7,634,041 B2 * | 12/2009 | Yu et al. | 375/376 |
| 7,924,072 B2 | 4/2011 | Palmer et al. | |
| 8,279,014 B2 * | 10/2012 | Chen et al. | 331/34 |
| 8,587,352 B2 * | 11/2013 | Koerner | 327/156 |
| 2010/0142641 A1 | 6/2010 | Cathelin et al. | |

FOREIGN PATENT DOCUMENTS

| | | |
|---|---|---|
| WO | WO 02/103609 | 12/2002 |
| WO | WO 2005/015744 | 2/2005 |
| WO | WO 2008/102091 | 8/2008 |

* cited by examiner

FRACTIONAL - N FREQUENCY SYNTHESIZER

MODULUS $M_1$

MASH 1-1-1 DDSM$_1$ EACH ACCUMULATOR
HAS MODULUS M$_1$

US 8,816,724 B2

NESTED DIGITAL DELTA-SIGMA MODULATOR

CROSS-REFERENCE TO RELATED APPLICATIONS

The present application claims priority to U.S. Provisional Patent Application No. 61/576,411, filed Dec. 16, 2011, titled "NESTED DIGITAL DELTA-SIGMA MODULATOR," the entirety of which is hereby incorporated herein by reference.

FIELD OF THE INVENTION

The disclosure relates to synthesizing radio frequencies using a frequency synthesizer in order to output a desired frequency.

BACKGROUND OF THE INVENTION

Wireless communication devices communicate by sending and receiving information in particular radio frequencies. These particular radio frequencies can be communication channels, just like channels on a radio. In order to receive a particular station on a radio, it is important to tune to the radio frequency that station is broadcast on. If one does not tune directly onto the proper frequency that the radio station is being broadcast on, then the radio will likely receive static or a signal that is not as clear.

Wireless communication devices typically use a frequency synthesizer to set the frequency of the communication channel. Just like the radio example above, it can be important for reliable and efficient wireless communications to have accurate and precise generation of specific radio frequencies. In order to generate the specific radio frequencies the frequency synthesizer often needs to create the desired frequency using reference frequencies. It can be difficult to produce a frequency synthesizer that is precise without the design of the frequency synthesizer becoming very complicated.

SUMMARY

The present disclosure provides methods and systems for a radio frequency synthesizer to generate precise frequencies over a large radio frequency range in some embodiments. The radio frequency synthesizer can provide a high resolution of frequency generation and still provide precise frequencies over a range of radio frequencies. In some embodiments, a fractional-N synthesizer system can be adapted to generate a signal at an output frequency from a reference frequency, wherein said output frequency is generated using a first modulus and a second modulus adapted to ensure that the output frequency can be set to an exact value.

In certain embodiments, the radio frequency synthesizer uses a programmable second modulus $M_2$ (which may or may not be a power of two) to define $f_{VCO}=(N_0+(N_1+N_2/M_2)/M_1) f_{PD}$. The resolution in this case is set by the product $M_1 \times M_2$ rather than by $M_1$ alone. With appropriate choices of $M_2$ and $M_1$, desired practical values of the output frequency $f_{VCO}$ can be set exactly.

In some embodiments, a fractional-N frequency synthesizer is provided that allows the frequency $f_{VCO}$ to be set exactly while maintaining the spur performance of a power-of-two-modulus divider. Furthermore, the spectral performance of the nested fractional-N frequency synthesizer can be improved by careful selection of the clocking frequencies of the first DDSM and the second DDSM.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF EMBODIMENTS

The present disclosure provides methods and systems for a radio frequency synthesizer to generate precise frequencies over a large radio frequency range in accordance with some embodiments. Typically, with radio frequency synthesizers, there is a trade-off between resolution and range of a frequency synthesizer. It is similar to the situation of choosing a measurement scale in order to measure something. While a ruler may be good at measuring small objects such a paper clip, it is not ideal for measuring the dimensions of a large room. The range of the ruler can be limited by its inherent resolution chosen beforehand.

In the same way, radio frequency synthesizers can have difficulty generating precise frequencies that also cover a number of frequencies in a range of frequencies. This is because radio frequency synthesizers use a reference frequency that is scaled to provide the output frequencies. Generally, past efforts to solve resolution and range problem have ended up with complex systems and/or performance issues.

The most widely used type is called a fractional-N synthesizer, whose output frequency is defined by $f_{VCO}=(N_0+N_1/M_1) f_{PD}$, where $f_{PD}$ is a very precise frequency that is typically defined by a crystal oscillator, and $N_0$, $N_1$, and $M_1$ are integers. $M_1$ is called the modulus and determines the frequency resolution $f_{res}=f_{PD}/M_1$.

$f_{PD}$ is typically a multiple of ten Hz and $M_1$ is a power of two. In the case of many desired practical values of $f_{VCO}$, it is impossible to set $f_{VCO}$ exactly because of the inevitable remainder when powers of two divide into multiples of ten.

A fractional-N frequency synthesizer generates a frequency $f_{VCO}$ which is a rational multiple of a precise reference frequency. The precision of $f_{VCO}$ is determined by the modulus which, for reasons of speed and ease of implementation, is usually a power of two. When the modulus is a power of two, $f_{VCO}$ has an inherent error and cannot be set exactly; this is a problem.

In an integer-N frequency synthesizer, the relationship between the output and reference frequencies is $$f_{VCO}=N_0 f_{PD};$$

where $N_0$ is a positive integer. The smallest frequency step is defined by $$f_{res} = f_{PD}$$

In a system that requires a channel spacing of $f_{CS}$, one could set $f_{CS}=f_{PD}$. To attenuate the reference spur (at frequency $f_{PD}$) at the output of the phase detector, the loop filter requires a bandwidth that is much less than $f_{PD}$ (typically one tenth of $f_{PD}$ or more). This has two important consequences:
1) the transient response of the loop is relatively slow, and
2) the energy storage elements in the loop filter are physically large.

An improved solution is the so-called fractional-N frequency synthesizer; this has a larger loop bandwidth, resulting in a faster transient response and a smaller loop filter.

Figure 1:
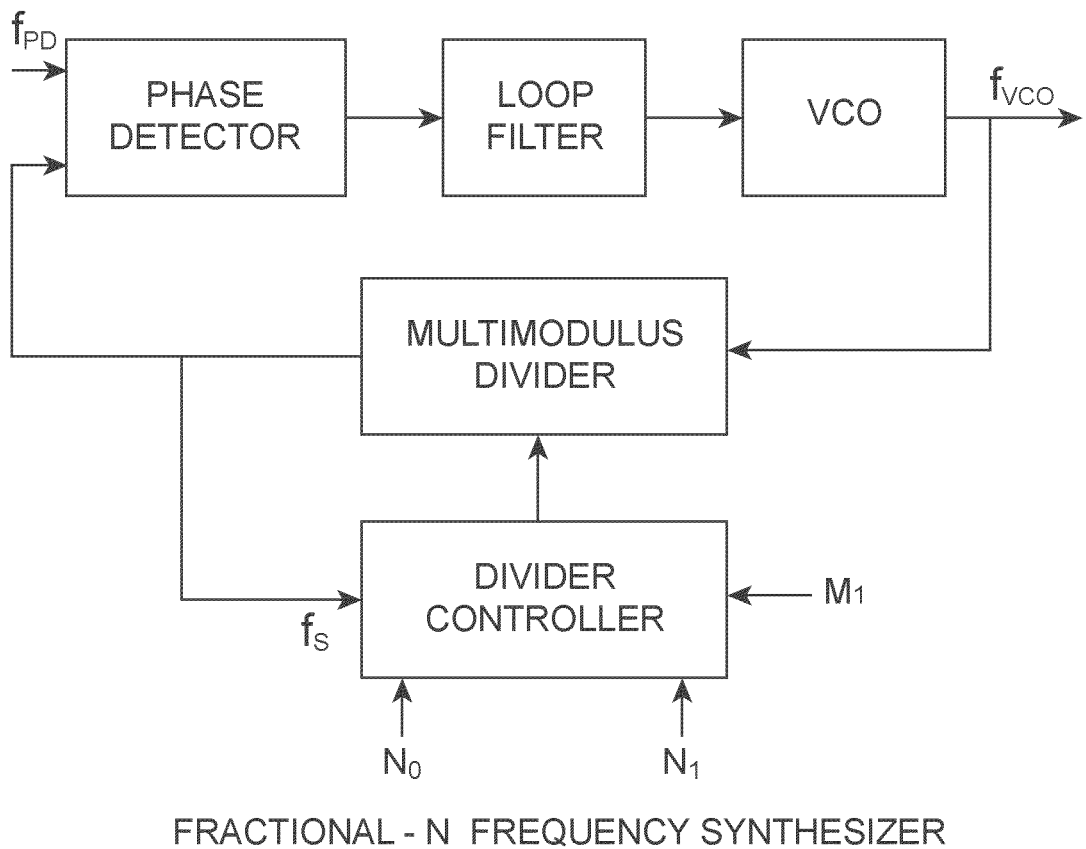
FIG. 1 illustrates a block diagram of a fractional-N frequency synthesizer.
Figure 2:
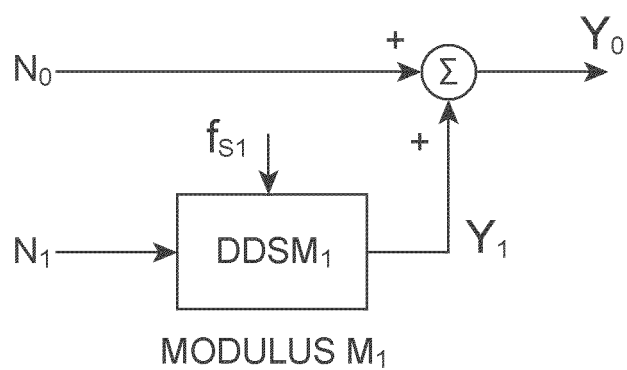
FIG. 2 illustrates a divider controller in a fractional-N frequency synthesizer.

An integer-N synthesizer has a fixed division ratio N. By contrast, in a fractional-N frequency synthesizer, the division ratio is updated at a frequency $f_s$, as illustrated in FIGS. 1 and 2. The instantaneous value of the division ratio is determined by a divider controller. A typical implementation of a divider controller comprises a Digital Delta-Sigma modulator (DDSM) with input $N_1$, modulus $M_1$, and output $Y_1$ and a summing element. The DDSM is clocked at a frequency $f_s$ by the output of the divider. $N_1$ and $M_1$ are chosen such that the average of $Y_1$ is $N_1/M_1$. The relationship between the output and reference frequencies is $$f_{VCO} = \left(N_0 + \frac{N_1}{M_1}\right)f_{PD},$$

where $M_1$ is called the modulus of the DDSM. $M_1$ is typically a large power of two. $N_0$ and $N_1$ are positive integers and $N_1 < M_1$. The frequency resolution is defined by $$f_{res} = \frac{1}{M_1} f_{PD}$$

For example, if $M_1=2^{20}(=1048576)$ and $f_{PD}=1.048576$ MHz, then $f_{res}=1$ Hz. To achieve a resolution of 1 Hz, an integer-N synthesizer would require $f_{PD}=1$ Hz and the bandwidth of the loop filter would have to be much less than 1 Hz. By contrast, to attenuate the reference spur from the phase detector in the fractional-N synthesizer, the loop filter will require a bandwidth that is less than 1.048576 MHz but much larger than 1 Hz. The use of a significantly higher value of $f_{PD}$ has two important consequences:
1) the transient response of the loop is much faster than in the integer-N case, and
2) the energy storage elements in the loop filter are physically smaller.

Figure 3:
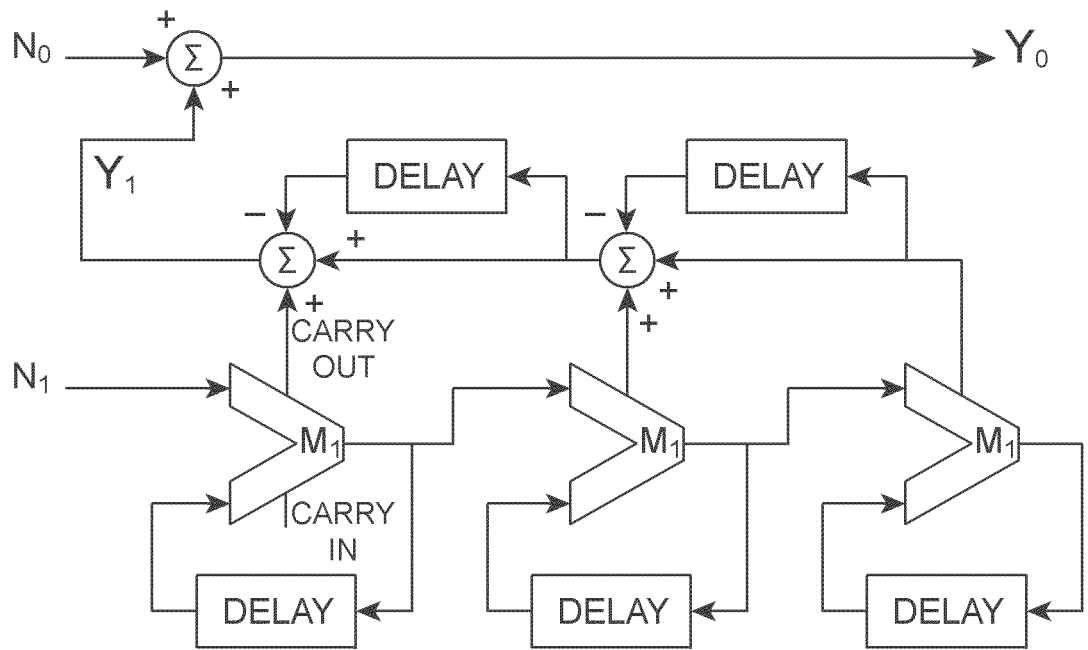
FIG. 3 illustrates an implementation of a MASH 1-1-1 $DDSM_1$ architecture for a fractional-N frequency synthesizer.

FIG. 3 shows an implementation of a MASH 1-1-1 DDSM$_1$ architecture for a fractional-N frequency synthesizer, where each accumulator has a modulus $M_1$.

The fractional-N synthesizer suffers from a number of problems that are related to this modulus $M_1$:
1) when $M_1$ is a power of two and $f_{PD}$ is not, it can be impossible to set a desired output frequency exactly.
2) undesirable tones appear in the output spectrum that are multiples of $f_{res}$. The smaller the numerator and denominator of the fraction $N_1/M_1$, and the larger the greatest common divisor (gcd) of $N_1$ and $M_1$, the larger the spurs.

One way to correct the first problem is to use a value of $M_1$ that is not a power of two. While this solves the first problem, it requires more complex circuitry to implement a programmable modulus, and it can make the second problem (spurs) worse.

Figure 4:
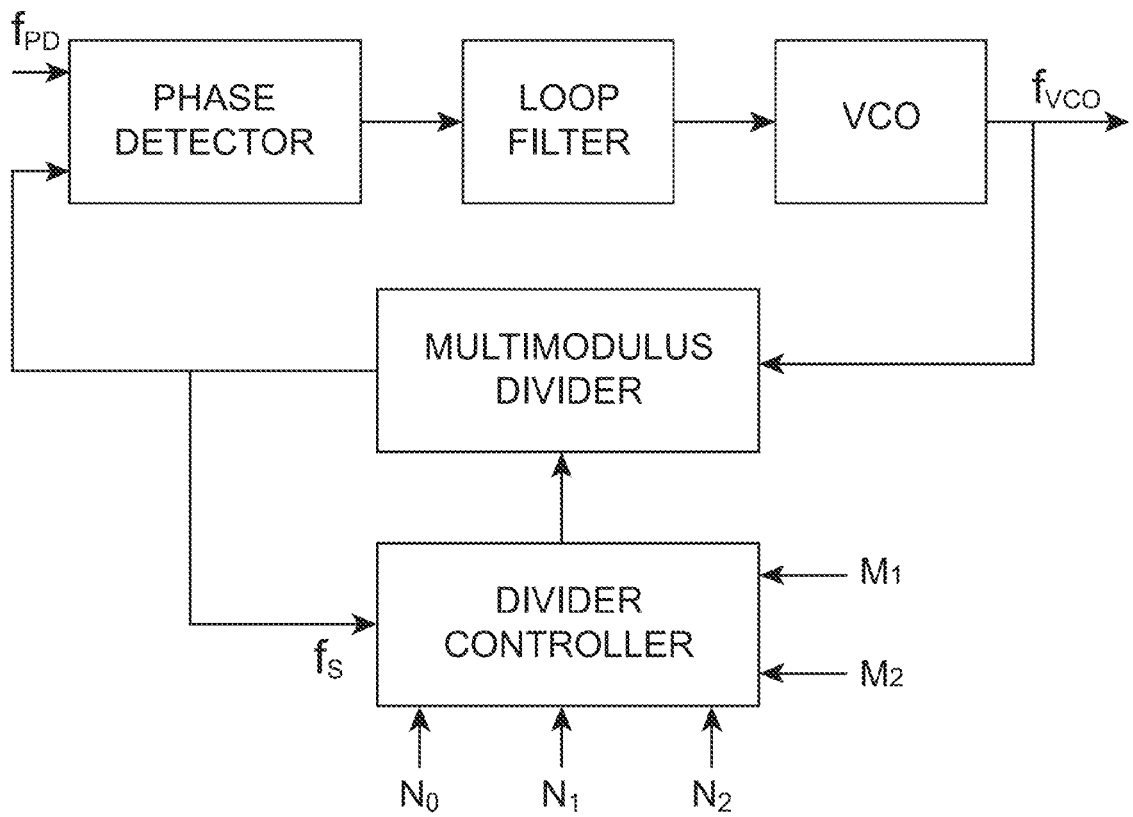
FIG. 4 illustrates a block diagram of a fractional-N frequency synthesizer according to one embodiment.
Figure 5:
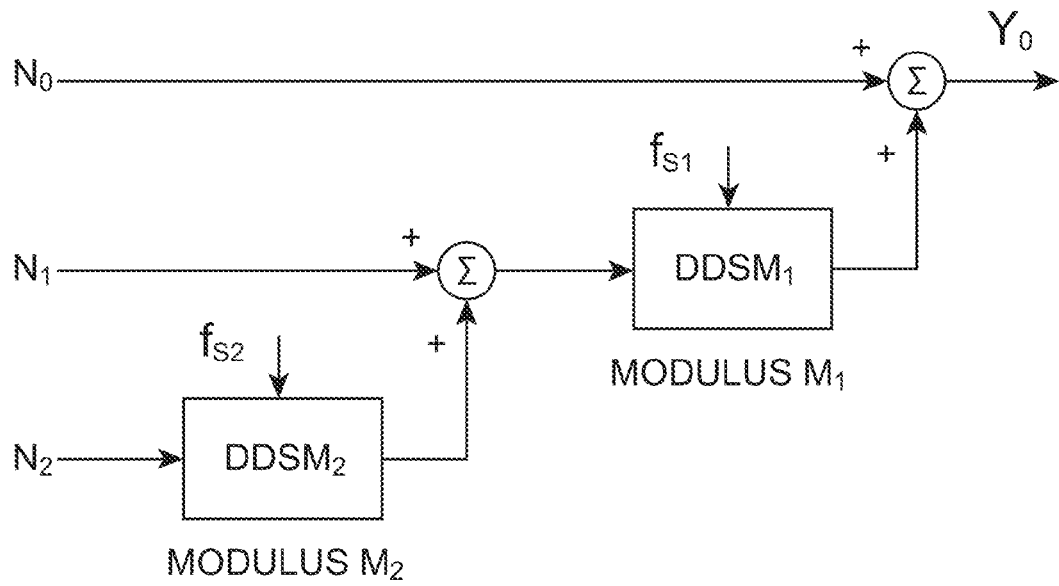
FIG. 5 illustrates a divider controller in a two-level nested fractional-N frequency synthesizer illustrating the architecture.

In the simplest nested fractional-N frequency synthesizer, as shown in FIG. 4, the relationship between the output and reference frequencies is:

$$f_{VCO} = \left(N_0 + \frac{\left(N_1 + \frac{N_2}{M_2}\right)}{M_1}\right)f_{PD},$$

where $M_1$ and $M_2$ are the moduli of two distinct Digital Delta Sigma Modulators (DDSMs), as shown in FIG. 5. The frequency resolution is defined by:

$$f_{res} = \frac{1}{M_1 M_2} f_{PD}.$$

By adding additional DDSMs with moduli $M_3$; $M_4$; : : : , etc the relationship becomes $$f_{VCO} = \left(N_0 + \frac{\left(N_1 + \frac{\left(N_2 + \frac{\left(N_3 + \frac{(N_4 + \ldots)}{M_4}\right)}{M_3}\right)}{M_2}\right)}{M_1}\right)f_{PD}.$$

In the simplest nested fractional-N structure, which has two moduli, $M_2$ is programmable but $M_1$ can be a power of two. The divider controller comprises a nested DDSM structure, as shown in FIG. 5 in accordance with some embodiments. The divider controller comprises two DDSMs, labelled DDSM1 and DDSM2, clocked at rates $f_{s1}$ and $f_{s2}$; respectively. These rates could be different, as described below. For simplicity, it is easier to consider the simplest case when they are equal.

In order to illustrate an example operation the performance of integer-N, fractional-N and nested fractional-N frequency synthesizers can be compared in the context of a specific design problem. The specifications are as shown in Table I.

The output frequency of the integer-N synthesizer is an integer multiple of the reference frequency, namely:

$$f_{VCO} = N_0 f_{PD}$$

Unfortunately, 2000.20 MHz is not an integer multiple of 61.44 MHz; therefore the specification cannot be met with an integer-N architecture.

TABLE I

| SPECIFICATIONS | | |
|---|---|---|
| Parameter | Value | Units |
| $f_{VCO}$ | 2000.20 | MHz |
| $f_{PD}$ | 61.44 | MHz |
| $f_{CS}$ | 100 | kHz |

In the fractional-N divider, $$f_{VCO} = \left(N_0 + \frac{N_1}{M_1}\right)f_{PD1}$$

Consider two cases: power-of-two modulus $M_1$ and programmable (not a power of two) modulus $M_1$.

1) Power-of-two modulus $M_1$: From Table II, $$f_{VCO} = \left(32 + \frac{582315}{1048576}\right)61.44 \text{ MHz}$$
$$= 2000.20001953 \text{ MHz}$$

Note that the power-of-two modulus results in a frequency error. The size of the error can be reduced by increasing the value of $M_1$, but it cannot be eliminated.

TABLE II

FRACTIONAL-N FREQUENCY SYNTHESIZER
WITH POWER-OF-TWO MODULUS DIVIDER

| Parameter | Value |
| --- | --- |
| $M_1$ | 1048576 |
| $N_0$ | 32 |
| $N_1$ | 582315 |

2) Programmable modulus $M_1$: From Table III, $$f_{VCO} = \left(32 + \frac{3412}{6144}\right)61.44 \text{ MHz}$$
$$= 2000.200000 \text{ MHz}$$

Note that the use of a programmable modulus results in no frequency error in this case.

TABLE III

FRACTIONAL-N FREQUENCY SYNTHESIZER
WITH PROGRAMMABLE MODULUS

| Parameter | Value |
| --- | --- |
| $M_1$ | 6144 |
| $N_0$ | 32 |
| $N_1$ | 3412 |

Note that $M_1$ is typically much smaller in the case of a programmable modulus compared to the power-of-two case (6144 versus 1048576 in this example). Indeed, the main problem associated with using a small modulus $M_1$ is that short cycles, and consequently large spurs, may occur.

Consider what happens when $f_{VCO}$=1996.80 MHz. In this case, $N_1$=3072 and $$f_{VCO} = \left(32 + \frac{3072}{6144}\right)61.44 \text{ MHz}$$
$$= 1996.800000 \text{ MHz}$$

With an even initial condition, a third-order MASH 1-1-1 DDSM has a cycle of length 4 and therefore produces a very strong spur at an offset from $f_{VCO}$ of 6144/4 MHz, namely 15.36 MHz. In the best case, the cycle length is 2×6144 and the quantization noise is spread over 12288 tones, the lowest of which is 5 kHz from $f_{VCO}$.

Next consider the nested fractional-N architecture, from Table IV,

TABLE IV

NESTED FRACTIONAL-N FREQUENCY SYNTHESIZER

| Parameter | Value |
| --- | --- |
| $M_1$ | 1048576 |
| $M_2$ | 3072 |
| $N_0$ | 32 |
| $N_1$ | 582314 |
| $N_2$ | 2048 |

$$f_{VCO} = \left(32 + \frac{582314 + \frac{2048}{3072}}{1048576}\right)61.44 \text{ MHz}$$
$$= 2000.200000 \text{ MHz}$$

Note that the use of multiple moduli, at least one of which is programmable, can result in zero frequency error. The programmable modulus associated with each modulator can be an integer with factors other than 2.

When the input to a DDSM is fixed or periodic, the system cycles through a finite number of states repeatedly. Consequently, its output signal contains a quantization noise component that is periodic. The length of the cycle determines the number of tones over which the quantization noise is spread in the frequency domain. The shorter the cycle, the fewer the tones and consequently the larger the average power per tone.

By contrast with the single programmable modulus case, the nested fractional-N synthesizer in this example has a very large effective modulus, namely 3072×1048576 (being the product of a first programmable modules which has 3 as a factor and a second modulus which is a large power of two). In this case, the cycle length is greater than $6 \times 10^6$, and the power in each tone of the quantization noise is extremely low.

Figure 6:
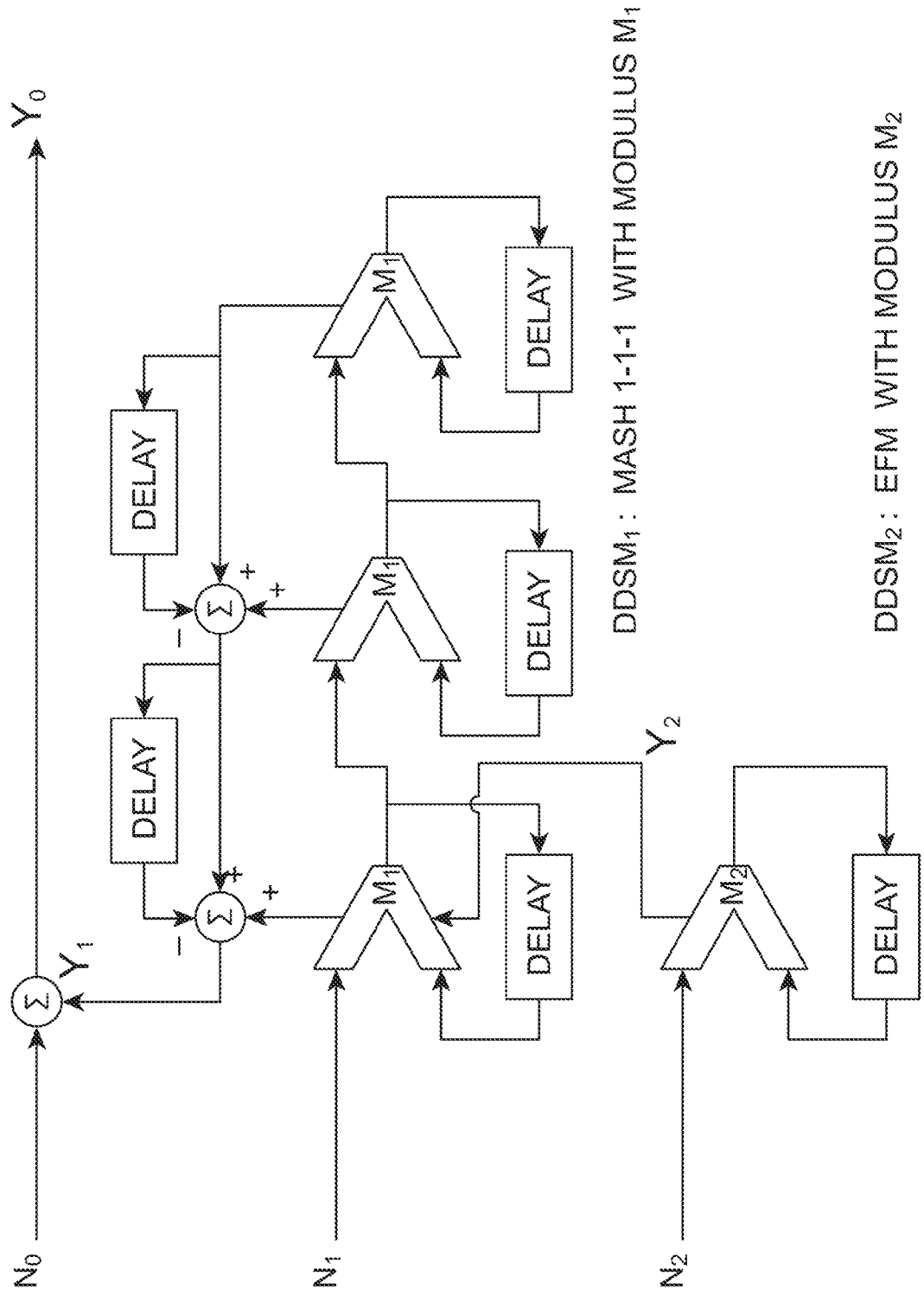
FIG. 6 illustrates an implementation of a $DDSM_1$ with modulus $M_1$ and $DDSM_2$ with modulus $M_2$ according to one embodiment.

Referring to FIGS. 5 and 6, an embodiment of a two-level nested DDSM divider controller is described in more detail. The controller comprises a first DDSM ($DDSM_1$) which can be a third order MASH 1-1-1 with fixed modulus M1, signal transfer function $STF_1=1/M_1$, and noise transfer function $NTF_1=(1-z^{-1})^3$. A second DDSM ($DDSM_2$) which is a first order Error Feedback Modulator (EFM) with programmable modulus $M_2$, signal transfer function $STF_2=1/M_2$, and noise transfer function $NTF_2=(1-z^{-1})$.

$DDSM_1$ is comprised of a cascade of three first order EFMs and a noise cancellation network. Each EFM can be a digital accumulator which has a primary input X and a secondary "carry in" input, and a "carry out" output Y.

$N_2$ is applied to the primary input of $DDSM_2$; its carry in input is zero. The output $Y_2$ of $DDSM_2$ is summed with $N_1$ and applied to the input of $DDSM_1$. Because $Y_2$ is a single bit, the sum can be performed implicitly by applying $N_1$ to the primary input of $DDSM_1$ and $Y_2$ to the secondary input.

The output $Y_1$ of $DDSM_1$ is summed with $N_0$ to produce the signal $Y_0$.

In FIG. 5, $DDSM_1$ and $DDSM_2$ are clocked at frequencies $f_{s1}$ and $f_{s2}$, respectively. In a conventional fractional-N frequency synthesizer, $f_{s1}=f_{PD}$. In the nested structure, one can choose $f_{s2}=f_{s1}$ or use a lower clock rate, such as $f_{s2}=f_{s1}/2$. $DDSM_1$ and $DDSM_2$ can be clocked synchronously at different rates $f_{s1}$ and $f_{s2}$, where $f_{s2} < f_{s1}$, or at the same rate $f_{s1} = f_{s2} = f_s$. This is advantageous as speed bottlenecks in the system are typically attributed to the comparator in the programmable modulus DDSM and the summer in $DDSM_1$. If the former is the problem, it can be alleviated by clocking $DDSM_2$ at a lower frequency than $DDSM_1$.

$M_1$ determines the attenuation of spurs and quantization noise from the second DDSM, as well as the worst case spur performance and quantization noise of the first DDSM. The value of $M_1$ should be chosen to satisfy constraints on the quantization noise and spurs.

Cycle lengths in $DDSM_1$ are influenced by $N_1$ and $M_1$. A variety of stochastic and deterministic techniques are available to maximize cycle lengths in $DDSM_1$. These include adding dither, setting an initial condition (called "seeding"), setting the LSB of the input, using prime modulus quantizers, and architectures such as a known HK-MASH structure. It is necessary to fix the problem of inherent spurs in the DDSMs when the inputs are constant. This can be done by adding dither, setting the initial condition (seeding), using prime modulus quantizers, or architectures such as the HK-MASH structure. A HK-MASH structure in $DDSM_1$ obviates the need for dither and seeding, for example using a HK MASH structure published by K. Hosseini and M. P. Kennedy, 'A sigma-delta modulator', 10 Apr. 2008. Patent no. WO2008041216-A1, and the entire disclosure of which is incorporated herein by reference.

These considerations also apply to conventional fractional-N frequency synthesizers. In order to maximize the simplicity and speed of $DDSM_1$, a power-of-two modulus can be used. Furthermore, architectures such as pipelined nested bus-splitting can be used to maximize the throughput of DDSM1. In the nested fractional-N synthesizer, the contribution of $Y_2$ to the output $Y_0$ is weighted by $STF_1$. The value of $M_1$ determines the attenuation of the shaped quantization noise component from $DDSM_2$.

Cycle lengths in DDSM2 are influenced by $N_2$ and $M_2$. As in $DDSM_1$, a variety of stochastic and deterministic techniques are available to maximize cycle lengths in $DDSM_2$. The range of options is restricted in this case because modulus $M_2$ is programmable and the required frequency correction is predetermined. Consequently cycle length maximization through architectural modifications such as prime modulus quantizers and HK-MASH (which put restrictions on $M_2$) cannot be used. By choosing $M_1$ sufficiently large, the potentially poor spectral performance of $DDSM_2$ can be spectrally masked by that of $DDSM_1$ using techniques such as those described in a paper entitled 'Recent Advances in the analysis, design and optimization of Digital Delta-Sigma Modulators', NOLTA, Jul. 1, 2012, IEICE, vol. 3, no. 3 pp 258-286.

Figure 7:
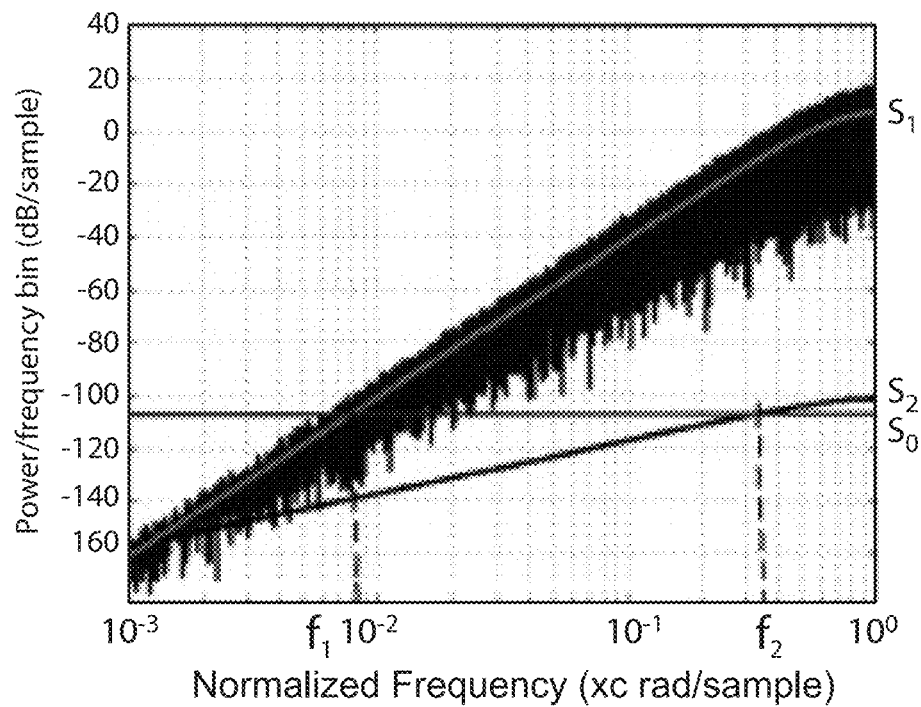
FIG. 7 illustrates the spectral components of $Y_0$ in a two-level nested fractional-N frequency synthesizer divider control in accordance with some embodiments.

FIG. 7 shows the spectral performance obtained by employing the two modulator nested structure of FIGS. 4 to 6. The conventional fractional-N modulator has the noise component $S_1$. The nested fractional-N modulator has similar spectral performance if the additional noise component $S_2$ is spectrally masked by $S_1$. FIG. 7 shows typical contributions of quantization noise to the signal $Y_0$. The jagged curve is the simulated power spectral density of $Y_0$. The solid curves $S_1$ and $S_2$ are estimates of the contributions from $DDSM_1$ and $DDSM_2$, respectively. $S_0$ indicates the noise floor associated with quantization at the input of $DDSM_1$.

Figure 8:
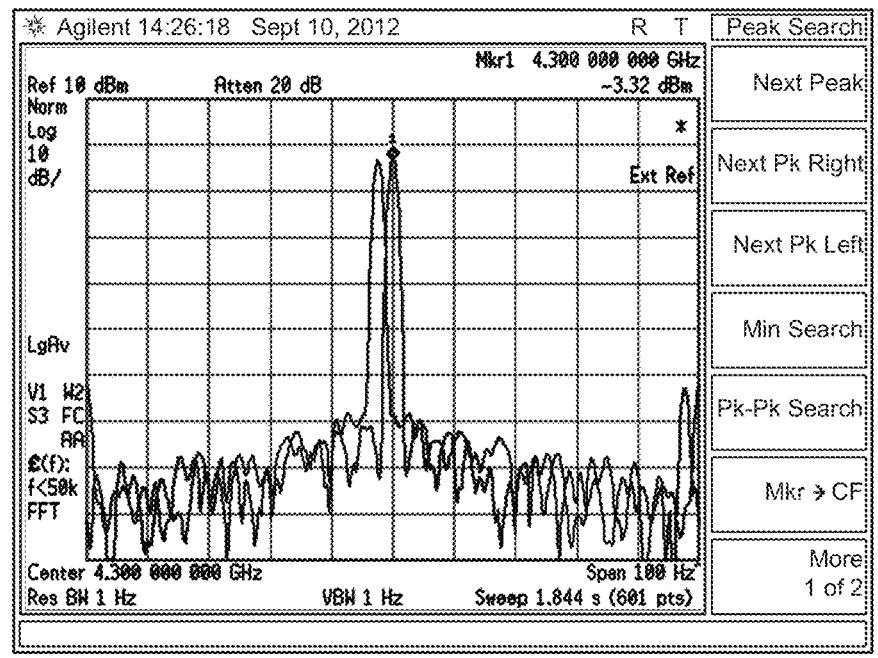
FIG. 8 illustrates results obtained for the two modulus nested structure of FIGS. 4 to 6 implemented in silicon.

FIG. 8 illustrates results obtained for a radio frequency synthesizer incorporating the two modulus nested structure of FIGS. 4 to 6 implemented in silicon. The peak shown in the center to the right shows an exact output frequency using the implementation of FIGS. 4 to 6 to provide an output precise frequency over a range of radio frequencies.

In some embodiments, a modified fractional-N frequency synthesizer is provided that allows the frequency step to be set exactly while maintaining the spur performance of a power-of-two-modulus divider. Furthermore, the spectral performance of the nested fractional-N frequency synthesizer is no worse than a conventional fractional-N synthesizer with a power-of-two divider. It will be appreciated that the above description describes the simplest DDSM structures. More complicated DDSMs with more complex transfer functions and multilevel quantizers can be used in accordance with the implementations shown in FIGS. 4 to 6.

An advantage of the radio frequency synthesizer is that a large value of $f_{PD}$ can be obtained. This allows use of smaller components in the loop filter and improves the transient response. For a given $f_{res}$, $f_{PD}$ in the nested fractional-N frequency synthesizer can be a factor of $M_2$ higher than in the conventional fractional-N.

The nested fractional-N architecture allows one to set the output frequency exactly while maintaining the architectural advantages and spur performance of a power-of-two modulus, overcoming the aforementioned problems.

Using a single power of two modulus $M_1$ alone permits high speed operation but produces an inexact frequency $f_{VCO}$. Using a modulus $M_1$ that is not a power of two produces an exact frequency but also unwanted tones (spurs) in the output signal. Using the first and second modulus $M_1$ and $M_2$ together has the advantage of both high speed and an exact frequency, without the spurs associated with a modulus that is not a power of two.

In one embodiment the first modulus comprises a value set at a power of two.

In one embodiment the first modulator is clocked to operate at a first frequency.

In one embodiment the second modulator is clocked to operate at a second frequency.

In one embodiment the second frequency is set to operate at a lower frequency than the first frequency adapted to eliminate speed bottlenecks in the system. The speed bottlenecks in the system are the comparator and/or summer in the programmable modulus DDSM2 and the summer in DDSM1. This is alleviated by clocking DDSM2 at a lower frequency than DDSM1.

In one embodiment the second modulus is programmable.

In one embodiment the frequency resolution of the system is governed by the equation:

$$f_{res} = f_{PD}/(M_1, M_2)$$

In one embodiment the relationship between the output frequency and reference frequency is governed by the equation:

$$f_{VCO} = \left(N_0 + \frac{\left(N_1 + \frac{N_2}{M_2}\right)}{M_1}\right) f_{PD1}$$

In one embodiment the first and second frequency are equal in value.

In one embodiment the output of the second modulus is weighted by a transfer function associated with the first modulus.

In another embodiment there is provided a fractional-N synthesizer system comprising an oscillator adapted to generate a signal at an output frequency from a reference frequency set by said oscillator, said output frequency is generated using a modulus having a value set at a power of two; and a second modulus adapted to ensure the output frequency equals the reference frequency.

In a further embodiment there is provided a divider controller for use in a nested fractional-N frequency synthesizer, said controller adapted to generate a signal at an output frequency from a reference frequency, wherein said output frequency is generated using a first modulus and a second modulus adapted to ensure the output frequency can be set to an exact value.

It will be appreciated that a computer program comprising program instructions for causing a computer program to control the operation of the first or second modulus or divider controller, which may be embodied on a record medium, carrier signal or read-only memory.

The embodiments in the disclosure described with reference to the drawings comprise a computer apparatus and/or processes performed in an integrated circuit. This disclosure also extends to computer programs, particularly computer programs stored on or in a carrier adapted to control operation of the frequency synthesizer as described herein. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

The invention is not limited to the embodiments hereinbefore described but may be varied in both construction and detail.

What is claimed is:

1. A fractional-N synthesizer that generates an output frequency signal, the fractional-N synthesizer comprising:
   an input that receives a reference frequency that is modified to generate the output frequency signal;
   a divider controller that determines a division ratio using a first modulus and a second modulus to reduce remainder error in the output frequency signal, wherein the first modulus is different from the second modulus; and
   an output that outputs the output frequency signal,
   wherein the first modulus is associated with a first digital delta-sigma modulator and the second modulus is associated with a second digital delta-sigma modulator, wherein the second digital delta-sigma modulator is electrically connected to the first digital delta-sigma modulator in a nested configuration.

2. A fractional-N synthesizer as claimed in claim 1 wherein the first modulus comprises a value set at a power of two.

3. A fractional-N synthesizer as claimed in claim 1 wherein the first digital delta-sigma modulator is clocked to operate at a first clock frequency and the second digital delta-sigma modulator is clocked to operate at a second clock frequency different from the first clock frequency.

4. A fractional-N synthesizer of claim 3 wherein the second clock frequency is set to operate at a lower frequency than the first clock frequency.

5. A fractional-N synthesizer of claim 1 wherein an output of the second digital delta-sigma modulator is weighted by a transfer function associated with the first digital delta-sigma modulator.

6. The fractional-N synthesizer as claimed in claim 1, wherein said first modulus and second modulus are configured to ensure the output frequency signal can be set to an exact value.

7. The fractional-N synthesizer as claimed in claim 1, further comprising a multimodulus divider, wherein the multimodulus divider includes an input configured to receive the output frequency signal, wherein the divider controller determines the division ratio using the first modulus and the second modulus by controlling a division ratio of the multimodulus divider.

8. The fractional-N synthesizer as claimed in claim 7, further comprising a phase detector including a first input and a second input, wherein the first input is configured to receive the reference frequency, and wherein the second input is electrically connected to an output of the multimodulus divider.

9. The fractional-N synthesizer as claimed in claim 8, further comprising a loop filter and a voltage controlled oscillator (VCO), wherein the loop filter includes an input electrically connected to an output of the phase detector, and wherein the loop filter further includes an output electrically connected to an input of the VCO, and wherein the VCO further includes an output configured to generate the output frequency signal.

10. The fractional-N synthesizer as claimed in claim 1, wherein the divider controller is further configured to receive a first integer input ($N_0$), a second integer input ($N_1$), and a third integer input ($N_2$), wherein a frequency relationship between the output frequency and the reference frequency is based on the first modulus, the second modulus, the first integer input, the second integer input, and the third integer input.

11. The fractional-N synthesizer of claim 1 wherein an order of the first digital delta-sigma modulator is greater than an order of the second digital delta-sigma modulator.

12. The fractional-N synthesizer of claim 1 wherein the first digital delta-sigma modulator is clocked to operate at a first clock frequency and the second digital delta-sigma modulator is clocked to operate at the first clock frequency.

13. The fractional-N synthesizer of claim 1 wherein the first modulus is greater than the second modulus.

14. A fractional-N synthesizer that generates an output frequency signal, the fractional-N synthesizer comprising:
   an input that receives a reference frequency that is modified to generate the output frequency signal;
   a divider controller that determines a division ratio using a first modulus and a second modulus to reduce remainder error in the output frequency signal; and
   an output that outputs the output frequency signal,
   wherein the second modulus is nested within the first modulus, wherein at least one of the first modulus or the second modulus is programmable.

15. The fractional-N synthesizer of claim 14 wherein the first modulus is associated with a first modulator and the second modulus is associated with a second modulator, wherein an order of the first modulator is greater than an order of the second modulator.

16. The fractional-N synthesizer of claim 14 wherein the second modulus is programmable.

17. The fractional-N synthesizer of claim 16 wherein the first modulus is a power of two.

18. A fractional-N synthesizer that generates an output frequency signal, the fractional-N synthesizer comprising:
an input that receives a reference frequency that is modified to generate the output frequency signal;
a divider controller that determines a division ratio using a first modulus and a second modulus to reduce remainder error in the output frequency signal; and
an output that outputs the output frequency signal,
wherein the first modulus is associated with a first modulator clocked to operate at a first clock frequency and the second modulus is associated with a second modulator clocked to operate at the first clock frequency, wherein the relationship between the output frequency and the reference frequency is governed by the equation:

$$f_{VCO} = \left(N_0 + \frac{\left(N_1 + \frac{N_2}{M_2}\right)}{M_1}\right) f_{PD1}.$$

19. The fractional-N synthesizer of claim 18 wherein the first modulus is different from the second modulus.

20. The fractional-N synthesizer of claim 18 wherein an order of the first modulator is greater than an order of the second modulator.

21. A method of generating an output frequency signal in a fractional-N frequency synthesizer comprising the steps of:
receiving a reference frequency at the fractional-N frequency synthesizer;
determining a division ratio in the fractional-N frequency synthesizer using a first modulus and a second modulus to reduce remainder error in the output frequency signal; and
outputting the output frequency signal from the fractional-N frequency synthesizer,
wherein the first modulus is associated with a first digital delta-sigma modulator and the second modulus is associated with a second digital delta-sigma modulator, wherein the second digital delta-sigma modulator is electrically connected to the first digital delta-sigma modulator in a nested configuration, wherein the first modulus and the second modulus are different.

22. The method of claim 21, further comprising operating the first digital delta-sigma modulator at a value of the first modulus and operating the second digital delta-sigma modulator at a value of the second modulus.

23. The method of claim 22, further comprising clocking the first digital delta-sigma modulator to operate at a higher frequency than the second digital delta-sigma modulator.

24. The method of claim 22 comprising the step of weighting an output of the second digital delta-sigma modulator by a transfer function associated with the first digital delta-sigma modulator.

25. The method of claim 21, further comprising modifying the value of the second modulus to reduce remainder error in the output frequency signal.

26. The method of claim 21 wherein an order of the first digital delta-sigma modulator is greater than an order of the second digital delta-sigma modulator.

27. A fractional-N synthesizer that generates an output frequency signal, the fractional-N synthesizer comprising:
an input that receives a reference frequency that is modified to generate the output frequency signal;
a divider controller that determines a division ratio using a first modulus and a second modulus to reduce remainder error in the output frequency signal; and
an output that outputs the output frequency signal,
wherein the divider controller is further configured to receive a first integer input ($N_0$), a second integer input ($N_1$), and a third integer input ($N_2$), wherein a frequency relationship between the output frequency and the reference frequency is based on the first modulus, the second modulus, the first integer input, the second integer input, and the third integer input, wherein the first modulus is different from the second modulus,
wherein the divider controller comprises a first digital delta sigma modulator (DDSM) and a second DDSM, wherein the second DDSM comprises an input configured to receive the third integer input, and wherein the first DDSM comprises an input configured to receive a sum of an output of the second DDSM and the second integer input.

28. The fractional-N synthesizer of claim 27 wherein an order of the first modulator is greater than an order of the second modulator.

29. The fractional-N synthesizer of claim 27 wherein the first modulator is clocked to operate at a first clock frequency and the second modulator is clocked to operate at the first clock frequency.

* * * * *